(12) United States Patent
Terasaki et al.

(10) Patent No.: US 6,194,037 B1
(45) Date of Patent: *Feb. 27, 2001

(54) METHOD OF PLASMA PROCESSING A SUBSTRATE PLACED ON A SUBSTRATE TABLE

(75) Inventors: Masato Terasaki; Kazunori Tsutsuguchi, both of Tokyo (JP)

(73) Assignee: Kokusai Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/774,223

(22) Filed: Dec. 27, 1996

(30) Foreign Application Priority Data

Dec. 28, 1995 (JP) .................................. 7-352700

(51) Int. Cl.[7] ........................................ H05H 1/24
(52) U.S. Cl. .................... 427/569; 427/579; 438/788; 438/792
(58) Field of Search .................. 427/579, 569, 427/578, 574, 563; 438/792, 788

(56) References Cited

U.S. PATENT DOCUMENTS

| | | | |
|---|---|---|---|
| 4,262,631 * | 4/1981 | Kubacki ........................ | 427/569 |
| 4,282,268 * | 8/1981 | Priestley et al. .............. | 427/579 |
| 4,361,595 * | 11/1982 | Kaganowicz et al. ........ | 427/579 |
| 4,394,401 * | 7/1983 | Shioya et al. ................ | 427/579 |
| 4,612,207 * | 9/1986 | Jansen ............................ | 427/579 |
| 4,869,922 * | 9/1989 | D'Agostino et al. .......... | 427/573 |
| 4,877,641 * | 10/1989 | Dory ............................. | 427/579 |
| 4,916,091 * | 4/1990 | Freeman et al. .............. | 427/562 |
| 5,098,865 * | 3/1992 | Machado et al. ............ | 437/238 |
| 5,254,497 * | 10/1993 | Liu ................................ | 437/173 |
| 5,362,526 * | 11/1994 | Wang et al. .................. | 427/573 |
| 5,380,566 * | 1/1995 | Robertson et al. ........... | 427/534 |
| 5,399,387 * | 3/1995 | Law et al. ..................... | 427/579 |
| 5,441,768 * | 8/1995 | Law et al. ..................... | 427/579 |
| 5,571,571 * | 11/1996 | Musaka et al. ............... | 427/575 |
| 5,653,812 * | 8/1997 | Petrmichl et al. ............ | 427/578 |

FOREIGN PATENT DOCUMENTS

| | | |
|---|---|---|
| 517548 * | 12/1992 | (EP) . |
| 60-150632 | 8/1985 | (JP) . |
| 04263423 | 9/1992 | (JP) . |
| 5-283379 * | 10/1993 | (JP) . |
| 6188305 | 7/1994 | (JP) . |
| 07335709 | 12/1995 | (JP) . |

OTHER PUBLICATIONS

*Hackh's Chemical Dictionary*, 3rd ed, J. Grant edition McGraw–Hill Book Co., Inc., N.Y. excerpt pp. 441 & 722, 1944 (no month).*

IBM Tech. Discl. Bulletin; vol. 34, No. 11, Apr. 1992 "Pump/Purge Procedure Using NEON Feedstock" pp. 237–238.*

* cited by examiner

Primary Examiner—Marianne Padgett
(74) Attorney, Agent, or Firm—Birch, Stewart, Kolasch & Birch, LLP (57) ABSTRACT

Disclosed is a plasma processing method which comprises the steps of: performing plasma processing for a substrate placed on a substrate table in a processing chamber through use of plasma generated by applying an RF power to a gas or gases within the processing chamber while maintaining the pressure within the chamber at a predetermined pressure by feeding the gas or gases into the chamber and by evacuating the gas or gases from the chamber; lifting the substrate off the substrate table after stopping the application of the RF power to terminate the plasma process, while continuing the feeding and evacuating the gas or gases to maintain the inside of the chamber at the predetermined pressure; evacuating the chamber to a high vacuum after lifting off the substrate; and transferring the substrate out of the chamber.

22 Claims, 5 Drawing Sheets

METHOD OF PLASMA PROCESSING A SUBSTRATE PLACED ON A SUBSTRATE TABLE

BACKGROUND OF THE INVENTION

1. Field of the Invention

The present invention relates to a plasma processing method and a plasma processing apparatus, and particularly to a plasma enhanced CVD (Chemical Vapor Deposition) method and a plasma enhanced CVD apparatus which are used for manufacturing semiconductor devices and liquid crystal display (LCD) devices.

2. Description of the Related Art

According to a conventional CVD method, while the interior pressure of a processing chamber is being controlled at a predetermined pressure through use of a predetermined gas, an RF power is applied between a cathode and an anode by an RF generator so as to generate plasma to thereby form a film on a substrate placed on a substrate table.

After the elapse of a predetermined period of time required to form the film, the application of the RF power, the feed of the reaction gas, and the pressure control of the processing chamber are simultaneously terminated, and the processing chamber is evacuated to establish a high vacuum therein. After the interior of the processing chamber reaches a predetermined degree of vacuum, the substrate is lifted off the substrate table, and subsequently the substrate is taken out from the processing chamber by a transfer robot.

However, in the case where a substrate is transferred in accordance with the above-described sequence of the conventional plasma enhanced CVD method after the formation of a film on the substrate, a transfer error occurs in some cases due to the following causes: the substrate remains adhered to an adjacent cathode while being transferred; the substrate once adheres to the cathode and then drops onto the substrate table; and the dropped substrate breaks. Furthermore, in some cases, the substrate sparks to a nearby grounded site. Such a spark blows out a part of the formed film or a device pattern, resulting in pattern missing. This has lead to a so-called dielectric breakdown wherein an insulated portion breaks down. As a result of such a potential substrate transfer error or dielectric breakdown, the sequence of the conventional plasma enhanced CVD method fails to provide a stable film formation process.

SUMMARY OF THE INVENTION

Accordingly, an object of the present invention is to provide a plasma processing method and a plasma processing apparatus capable of preventing a substrate transfer error or a dielectric breakdown which may occur during the transfer of a plasma-processed substrate.

The inventors of the present invention have carried out extensive studies, and as a result, have come to think that the above-described substrate transfer error and dielectric breakdown are caused by a charge established in a substrate by plasma discharge while a film is being formed, as well as by a charge established in the substrate by separation electrification which takes place when the substrate is separated from a substrate table. That is, when the substrate, which has already been charged on the substrate table by plasma discharge conducted to form a film thereon, is lifted off the substrate table under high vacuum, a separation electrification occurs, which further increases the electric potential of the charged substrate. This electrification-induced electric potential increases as the lifting speed of the substrate increases. By contrast, as the lifting speed decreases, the electrification-induced electric potential is suppressed accordingly. As described above, since the substrate is charged by plasma and the electrification-induced electric potential of the charged substrate increases due to the separation-electrification, strong static electricity is generated, so that the substrate remains electrostatically adhered to an adjacent cathode while being transferred, the substrate electrostatically once adheres to the cathode and subsequently drops onto the substrate table, or the dropped substrate breaks, thus causing a transfer error. Moreover, since the charge established in the substrate tends to escape to a nearby grounded site, the substrate sparks to the nearby grounded site. Such a spark blows out a part of a formed film or a device pattern, resulting in pattern missing. This leads to a so-called dielectric breakdown wherein an insulated portion breaks down.

The present invention was made based on the above-described findings, and according to a first aspect of the present invention, there is provided a first plasma processing method comprising the steps of:

performing plasma processing for a substrate placed on a substrate table in a processing chamber through use of plasma generated by applying an RF power to a gas or gases within the processing chamber;

exposing the substrate to a predetermined gas atmosphere within the processing chamber for a predetermined period of time after stopping the application of the RF power; and thereafter taking the substrate out of the processing chamber.

The inventors of the present invention consider that an electrification-induced charge established in a substrate due to plasma discharge during plasma processing is removed by exposing the substrate to a predetermined gas atmosphere within the processing chamber for a predetermined period of time after stopping the application of the RF power.

According to a second aspect of the present invention, there is provided a second plasma processing method as recited in the first method, wherein the step of exposing the substrate to the predetermined gas atmosphere is the step of removing a charge from the substrate in the predetermined gas atmosphere.

According to a third aspect of the present invention, there is provided a third plasma processing method as recited in the first method, wherein the step of exposing the substrate to the predetermined gas atmosphere comprises the step of separating the substrate from the substrate table in the predetermined gas atmosphere.

The inventors of the present invention also consider that when the substrate is separated from the substrate table in a predetermined gas atmosphere, an electrification charge created due to separation of the substrate can be removed, or creation of such a charge can be suppressed or prevented.

According to a fourth aspect of the present invention, there is provided a fourth plasma processing method as recited in the first method, wherein the step of exposing the substrate to the predetermined gas atmosphere is the step of exposing the substrate to the predetermined gas atmosphere for a predetermined period of time in a state in which the substrate is placed on the substrate table within the processing chamber, and the method further comprises the step of separating the substrate from the substrate table within the processing chamber after the exposing step.

According to a fifth aspect of the present invention, there is provided a fifth plasma processing method as recited in the fourth method, wherein the step of separating the substrate from the substrate table is performed in a second predetermined gas atmosphere.

According to a sixth aspect of the present invention, there is provided a sixth plasma processing method as recited in the fifth method, wherein the second predetermined gas atmosphere consists essentially of the same gas or gases as the predetermined gas atmosphere consists essentially of.

In this case, it is preferred that after the substrate is exposed to a predetermined gas atmosphere for a predetermined period of time while being placed on the substrate table, the substrate is separated from the substrate table in the same gas atmosphere.

According to a seventh aspect of the present invention, there is provided a seventh plasma processing method as recited in any one of the first to sixth methods, wherein the step of exposing the substrate to the predetermined gas atmosphere is the step of exposing the substrate to a predetermined gas atmosphere within the processing chamber for a predetermined period of time immediately after stopping the application of the RF power.

According to a eighth aspect of the present invention, there is provided a eighth plasma processing method as recited in any one of the first to seventh methods, wherein the step of performing plasma processing for the substrate is the step of processing the substrate placed on the substrate table in the processing chamber through use of plasma generated by applying an RF power to the gas or the gases within the processing chamber, while maintaining the pressure within the processing chamber at a predetermined pressure by feeding the gas or the gases into the processing chamber and evacuating the gas or the gases from the chamber; and the step of exposing the substrate to the predetermined gas atmosphere is the step of stopping the application of the RF power after the plasma processing and exposing the substrate to the predetermined gas atmosphere within the processing chamber for the predetermined period of time, while continuing the feed of at least one of the gas or the gases flowing into the processing chamber even after stopping the application of the RF power.

In the above-described plasma processing method, only stopping application of the RF power, or only stopping the application of the RF power and the supply of the unnecessary gas or gases is required, and it becomes unnecessary to switch a gas or gases used for formation of film to a different kind of gas or gases, it is possible to eliminate loss time due to switching of gases. Also, since the processing chamber and the substrate are exposed to the same gas as that used in plasma processing, fear of contamination can be eliminated, and a subsequent plasma processing can be performed with excellent reproducibility. The pressure of the gas atmosphere is preferably maintained at the same pressure as that employed during film formation.

According to a ninth aspect of the present invention, there is provided a ninth plasma processing method as recited in the eighth method, wherein the step of continuing the feed of at least one of the gas or the gases flowing into the processing chamber so as to expose the substrate to the predetermined gas atmosphere within the processing chamber for the predetermined period of time is the step of stopping the application of RF power after the plasma processing, and after stopping the application of the RF power, exposing the substrate to the predetermined gas atmosphere within the processing chamber for the predetermined period of time, while continuously feeding all of the gas or the gases that were fed into the processing chamber during the plasma processing.

Employing the ninth method, only stopping the application of the RF power is required, and the operation becomes simple. Moreover, in the case where the pressure of the gas atmosphere is maintained at the same pressure as that employed during film formation, the operation becomes simpler.

According to a tenth aspect of the present invention, there is provided a tenth plasma processing method as recited in any one of the first to ninth methods, wherein the predetermined gas atmosphere and the second predetermined gas atmosphere are created by causing the gas or the gases to continuously flow through the processing chamber.

According to an eleventh aspect of the present invention, there is provided an eleventh plasma processing method as recited in any one of the first to ninth methods, wherein the predetermined gas atmosphere and the second predetermined gas atmosphere are created by stopping the evacuation from the processing chamber.

According to a twelfth aspect of the present invention, there is provided a twelfth plasma processing method as recited in any one of the first to eleventh methods, wherein each of the predetermined gas atmosphere and the second predetermined gas atmosphere has a controlled pressure.

According to a thirteenth aspect of the present invention, there is provided a thirteenth plasma processing method as recited in the twelfth method, wherein each of the predetermined gas atmosphere and the second predetermined gas atmosphere is a gas atmosphere whose pressure is controlled at the same pressure as that during the plasma processing.

According to a fourteenth aspect of the present invention, there is provided a fourteenth plasma processing method as recited in any one of the first to thirteenth methods, wherein each of the predetermined gas atmosphere and the second predetermined gas atmosphere is a gas atmosphere wherein a gas flow rate is controlled at the same flow rate as that used during the plasma processing. This method facilitates the gas operation.

According to a fifteenth aspect of the present invention, there is provided a fifteenth plasma processing method as recited in any one of the twelfth to fourteenth methods, wherein each of the predetermined gas atmosphere and the second predetermined gas atmosphere is a gas atmosphere whose pressure is controlled at a pressure in the range of 0.2–1.5 Torr. The pressure range is suitable for a plasma enhanced CVD, especially suitable for formation of silicon oxide film by plasma enhanced CVD.

According to a sixteenth aspect of the present invention, there is provided a sixteenth plasma processing method as recited in any one of the first to fifteenth methods, wherein each of the predetermined gas atmosphere and the second predetermined gas atmosphere consists essentially of one or more kinds of gasses among the gases used during the plasma processing.

Since the processing chamber and the substrate are exposed to the same gas or gases as that used in plasma processing, fear of contamination can be eliminated, and a subsequent plasma processing can be performed with excellent reproducibility. The pressure of the gas atmosphere is preferably maintained at the same pressure as that employed during film formation.

According to a seventeenth aspect of the present invention, there is provided a seventeenth plasma processing method as recited in any one of the first to sixteenth methods, wherein each of the predetermined gas atmosphere and the second predetermined gas atmosphere includes at least one kind of reduction gas. $NH_3$, $PH_3$, $H_2$, $SiH_4$ or the like is preferably used as the reduction gas.

According to an eighteenth aspect of the present invention, there is provided an eighteenth plasma processing method as recited in any one of the first to seventeenth methods, wherein each of the predetermined gas atmosphere and the second predetermined gas atmosphere includes at least one kind of gas that includes an oxygen atom in its structural formula. An $N_2O$ gas is preferably used as the gas that includes an oxygen atom in its structural formula.

According to a nineteenth aspect of the present invention, there is provided a nineteenth plasma processing method as recited in any one of the first to eighteenth methods, wherein the plasma processing is formation of a film on the substrate by a plasma enhanced CVD method.

For example, in production of LCDs, $SiO_2$ film, SiN film, amorphous silicon film, $n^+$-amorphous silicon film, and other similar films are formed by plasma enhanced CVD. Especially, the effect of the present invention becomes remarkable when $SiO_2$ film or SiN film is formed. In production of LCDs, glass plates are mainly used as substrates. The present invention is also applicable to production of semiconductor devices. In this case, Si wafers are mainly used as substrates.

According to a twentieth aspect of the present invention, there is provided a twentieth plasma processing method as recited in any one of the first to nineteenth methods, wherein the plasma processing is formation of a film on the substrate by a plasma enhanced CVD method, and each of the predetermined gas atmosphere and the second predetermined gas atmosphere includes at least one kind of gas that includes in its structural formula the same atom as the component atom of the film formed on the substrate. Preferably, each of the predetermined gas atmosphere and the second predetermined gas atmosphere consists essentially of at least one kind of gas that includes in its structural formula the same atom as the component atom of the film formed on the substrate.

When the substrate is exposed to an atmosphere of a gas or gases that includes in its structure formula an atom which is the same as the component atom of the formed film, the processing chamber and the substrate are exposed to the same gas component as that during plasma processing. In this case, fear of contamination can be eliminated, and a subsequent plasma processing can be performed with excellent reproducibility.

According to a twenty first aspect of the present invention, there is provided a twenty first plasma processing method as recited in the twentieth method, wherein the plasma processing is formation of a silicon oxide film by a plasma enhanced CVD method, and each of the predetermined gas atmosphere and the second predetermined gas atmosphere includes one or more kinds of gases selected from the group consisting of a gas that includes an Si atom in its structural formula, a gas that includes an oxygen atom in its structural formula, and a gas that includes an Si atom and an oxygen atom in its structural formula.

Preferably, each of the predetermined gas atmosphere and the second predetermined gas atmosphere consists essentially of one or more kinds of gases selected from the group consisting of a gas that includes an Si atom in its structural formula, a gas that includes an oxygen atom in its structural formula, and a gas that includes an Si atom and an oxygen atom in its structural formula.

According to a twenty second aspect of the present invention, there is provided a twenty second plasma processing method as recited in the twentieth method, wherein the plasma processing is formation of a silicon nitride film by a plasma enhanced CVD method, and each of the predetermined gas atmosphere and the second predetermined gas atmosphere includes one or more kinds of gases selected from the group consisting of a gas that includes an Si atom in its structural formula, a gas that includes a nitrogen atom in its structural formula, and a gas that includes an Si atom and a nitrogen atom in its structural formula.

Preferably, each of the predetermined gas atmosphere and the second predetermined gas atmosphere consists essentially of one or more kinds of gases selected from the group consisting of a gas that includes an Si atom in its structural formula, a gas that includes a nitrogen atom in its structural formula, and a gas that includes an Si atom and a nitrogen atom in its structural formula.

According to a twenty third aspect of the present invention, there is provided a twenty second plasma processing method as recited in the twentieth method, wherein the plasma processing is formation of an amorphous silicon film by a plasma enhanced CVD method, and an impurity of the thirteenth group or the fifteenth group is doped into the film, and wherein when an impurity of the thirteenth group is doped into the amorphous silicon film, each of the predetermined gas atmosphere and the second predetermined gas atmosphere includes one or more kinds of gases selected from the group consisting of a gas that includes an Si atom in its structural formula, a gas that includes an atom of the thirteenth group in its structural formula, and a gas that includes an Si atom and an atom of the thirteenth group in its structural formula, and when an impurity of the fifteenth group is doped into the amorphous silicon film, each of the predetermined gas atmosphere and the second predetermined gas atmosphere includes one or more kinds of gases selected from the group consisting of a gas that includes an Si atom in its structural formula, a gas that includes an atom of the fifteenth group in its structural formula, and a gas that includes an Si atom and an atom of the fifteenth group in its structural formula.

Preferably, when an impurity of the thirteenth group is doped into the amorphous silicon film, each of the predetermined gas atmosphere and the second predetermined gas atmosphere consists essentially of one or more kinds of gases selected from the group consisting of a gas that includes an Si atom in its structural formula, a gas that includes an atom of the thirteenth group in its structural formula, and a gas that includes an Si atom and an atom of the thirteenth group in its structural formula. Preferably, when an impurity of the fifteenth group is doped into the amorphous silicon film, each of the predetermined gas atmosphere and the second predetermined gas atmosphere consists essentially of one or more kinds of gases selected from the group consisting of a gas that includes an Si atom in its structural formula, a gas that includes an atom of the fifteenth group in its structural formula, and a gas that includes an Si atom and an atom of the fifteenth group in its structural formula.

B (Boron) can be mentioned as an example of an impurity of the thirteenth group, and in this case, $B_2H_6$ or the like is preferably used as a gas that includes an atom of the thirteenth group in its structural formula.

P (Phosphorus) and As (Arsenic) can be mentioned as examples of an impurity of the fifteenth group, and in this case, $PH_3$, $AsH_3$, or the like is preferably used as a gas that includes an atom of the fifteenth group in its structural formula.

According to a twenty fourth aspect of the present invention, there is provided a twenty fourth plasma processing method as recited in the twentieth or twenty third method, wherein the plasma processing is formation of an n-type amorphous silicon film by a plasma enhanced CVD method, and each of the predetermined gas atmosphere and the second predetermined gas atmosphere includes one or more kinds of gases selected from the group consisting of a gas that includes an Si atom in its structural formula, a gas that includes a phosphorus atom in its structural formula, and a gas that includes an Si atom and a phosphorus atom in its structural formula.

Preferably, each of the predetermined gas atmosphere and the second predetermined gas atmosphere consists essentially of one or more kinds of gases selected from the group consisting of a gas that includes an Si atom in its structural formula, a gas that includes a phosphorus atom in its structural formula, and a gas that includes an Si atom and a phosphorus atom in its structural formula.

$PH_3$ is preferably used as a gas that includes phosphorus atoms in its structural formula. This method is particularly suitable for formation of an $n^+$ type amorphous silicon film.

According to a twenty fifth aspect of the present invention, there is provided a twenty fifth plasma processing method as recited in the twentieth method, wherein the plasma processing is formation of an amorphous silicon film by a plasma enhanced CVD method, and each of the predetermined gas atmosphere and the second predetermined gas atmosphere includes a gas that includes an Si atom in its structural formula.

Preferably, each of the predetermined gas atmosphere and the second predetermined gas atmosphere consists essentially of a gas that includes an Si atom in its structural formula.

According to a twenty sixth aspect of the present invention, there is provided a twenty sixth plasma processing method as recited in any one of the twentieth to twenty fifth methods, wherein each of the predetermined gas atmosphere and the second predetermined gas atmosphere further includes an inert gas or hydrogen gas.

The present invention can be effectively applied to the case where a reaction gas diluted with an inert gas or hydrogen gas is used as a raw material gas. $N_2$ gas, or a rare gas such as Ne, Ar, Kr or Xe is used as the inert gas.

According to a twenty seventh aspect of the present invention, there is provided a twenty seventh plasma processing method as recited in any one of the twenty first to twenty sixth method, wherein the gas that includes an Si atom in its structural formula is a gas represented by a structural formula $Si_nH_{2n+2}$, where n is an integer equal to or greater than 1.

For example, in the case where the gas that includes an Si atom in its structural formula is $SiH_4$, the gas may be switched to $Si_2H_6$ or $Si_3H_8$ after application of RF power is stopped, although the $SiH_4$ atmosphere may be maintained. These gases are represented by the structural formula $Si_nH_{2n+2}$.

According to a twenty eighth aspect of the present invention, there is provided a twenty eighth plasma processing method as recited in the twenty seventh method, wherein each of the predetermined gas atmosphere and the second predetermined gas atmosphere further includes a $H_2$ gas.

For example, the gas used for film formation is a gas represented by the structural formula $Si_nH_{2n+2}$, Si contributes to film formation, and some of the hydrogen atoms become $H_2$ and are evacuated. Therefore, even when $H_2$ is added to a gas having a structural formula $Si_nH_{2n+2}$, no problems occur.

According to a twenty ninth aspect of the present invention, there is provided a twenty ninth plasma processing method as recited in the twenty second method, wherein the gas that includes an Si atom in its structural formula consists essentially of one or more kinds of gases selected from the group consisting of $SiF_4$, $SiH_2Cl_2$, and $Si_2F_6$.

For formation of silicon nitride film, $SiF_4$, $SiH_2Cl_2$, or $Si_2F_6$ can be used, and in this case, one or more kinds of gases selected from the group consisting of $SiF_4$, $SiH_2Cl_2$, and $Si_2F_6$ are preferably used as the gas that includes an Si atom in its structural formula.

According to a thirtieth aspect of the present invention, there is provided a thirtieth plasma processing method as recited in the twenty first method, wherein the gas that includes an oxygen atom in its structural formula consists essentially of one or more kinds of gases selected from the group consisting of $N_2O$, $CO_2$, CO, and $O_2$, For formation of silicon oxide film, $N_2O$, $CO_2$, CO, or $O_2$ is preferably used, and in this case, one or more kinds of gases selected from the group consisting of $N_2O$, $CO_2$, CO, and $O_2$ are preferably used as the gas that includes an oxygen atom in its structural formula.

According to a thirty first aspect of the present invention, there is provided a thirty first plasma processing method as recited in the twenty second method, wherein the gas that includes a nitrogen atom in its structural formula consists essentially of one or more kinds of gases selected from the group consisting of $NH_3$, $N_2$, and $NF_3$.

For formation of silicon nitride film, $NH_3$, $N_2$, or $NF_3$ is preferably used, and in this case, one or more kinds of gases selected from the group consisting of $NH_3$, $N_2$, and $NF_3$ are preferably used as the gas that includes a nitrogen atom in its structural formula.

According to a thirty second aspect of the present invention, there is provided a thirty second plasma processing method as recited in the twenty fourth method, wherein the gas that includes a phosphorus atom in its structural formula is $PH_3$.

P (Phosphorus) is preferably used as an n-type dopant, and in this case, $PH_3$ is preferably used as the gas that includes a phosphorus atom in its structural formula.

According to a thirty third aspect of the present invention, there is provided a thirty third plasma processing method as recited in any one of the first to thirty second methods, wherein a rare gas is further added into the predetermined gas atmosphere after the application of the RF power is stopped.

According to a thirty fourth aspect of the present invention, there is provided a thirty fourth plasma processing method as recited in any one of the first to sixteenth methods, wherein the plasma processing is processing for forming a film, which is selected from a silicon oxide film, a silicon nitride film, an amorphous silicon film, an $n^+$-amorphous silicon film, a single crystal silicon film, and a polycrystalline silicon film, through use of plasma generated by applying an RF power to a gas atmosphere including a gas that includes an F atom in its structural formula, and one or more kinds of gases selected from the group consisting of $H_2$, He, $N_2$, $O_2$, $NH_3$, and CO, and each of the predetermined gas atmosphere and the second predetermined gas atmosphere includes a gas that includes an F atom in its structural formula, and one or more kinds of gases selected from the group consisting of $H_2$, He, $N_2$, $O_2$, $NH_3$, and CO.

Preferably, the film is formed by applying an RF power to a gas atmosphere consisting essentially of a gas that includes an F atom in its structural formula, and one or more kinds of gases selected from the group consisting of $H_2$, He, $N_2$, $O_2$, $NH_3$, and CO, and each of the predetermined gas atmosphere and the second predetermined gas atmosphere consists essentially of a gas that includes an F atom in its structural formula, and one or more kinds of gases selected from the group consisting of $H_2$, He, $N_2$, $O_2$, $NH_3$, and CO.

Any of $F_2$, $SF_6$, $NF_3$, $CF_4$, $C_2F_6$, $C_3F_8$, and $CHF_3$ is preferably used as the gas that includes an F atom in its structural formula, and in etching process, any one of $H_2$, He, $N_2$, $O_2$, $NH_3$, and CO is preferably added to the gas that includes an F atom in its structural formula so as to perform processing. Therefore, it is preferred that the predetermined gas atmosphere and the second predetermined gas atmosphere contain the gas that includes an F atom in its structural formula, and one or more kinds of gases selected from the group consisting of $H_2$, He, $N_2$, $O_2$, $NH_3$, and CO.

According to a thirty fifth aspect of the present invention, there is provided a thirty fifth plasma processing method as recited in any one of the first to sixteenth methods, wherein the plasma processing is processing for forming a film, which is selected from a silicon oxide film, a silicon nitride film, an amorphous silicon film, an $n^+$-amorphous silicon film, a single crystal silicon film, and a polycrystalline silicon film, through use of plasma generated by applying an RF power to a gas atmosphere including a gas that includes a Cl atom in its structural formula, and one or more kinds of gases selected from the group consisting of $H_2$, He, $N_2$, $O_2$, $NH_3$, and CO, and each of the predetermined gas atmosphere and the second predetermined gas atmosphere includes a gas that includes a Cl atom in its structural formula, and one or more kinds of gases selected from the group consisting of $H_2$, He, $N_2$, $O_2$, $NH_3$, and CO.

Preferably, the film is formed by applying an RF power to a gas atmosphere consisting essentially of a gas that includes a Cl atom in its structural formula, and one or more kinds of gases selected from the group consisting of $H_2$, He, $N_2$, $O_2$, $NH_3$, and CO, and each of the predetermined gas atmosphere and the second predetermined gas atmosphere consists essentially of a gas that includes a Cl atom in its structural formula, and one or more kinds of gases selected from the group consisting of $H_2$, He, $N_2$, $O_2$, $NH_3$, and CO.

Any of HCl, $Cl_2$, $BCl_3$, and $CCl_4$ is preferably used as the gas that includes a Cl atom in its structural formula, and in etching process, any one of $H_2$, He, $N_2$, $O_2$, $NH_3$, and CO is preferably added to the gas that includes a Cl atom in its structural formula so as to perform processing. Therefore, it is preferred that the predetermined gas atmosphere and the second predetermined gas atmosphere contain the gas that includes a Cl atom in its structural formula, and one or more kinds of gases selected from the group consisting of $H_2$, He, $N_2$, $O_2$, $NH_3$, and CO.

According to a thirty sixth aspect of the present invention, there is provided a thirty sixth plasma processing method as recited in any one of the first to sixteenth methods, wherein the plasma processing is processing for etching an ITO (Indium Tin Oxide) film through use of plasma generated by applying an RF power to a HI gas, and each of the predetermined gas atmosphere and the second predetermined gas atmosphere is HI gas atmosphere.

According to a thirty seventh aspect of the present invention, there is provided a thirty seventh plasma processing method as recited in any one of the first to sixteenth methods, wherein the plasma processing is processing for etching an Al film through use of plasma generated by applying an RF power to a gas atmosphere including one or more kinds of gases selected from the group consisting of HCl, $Cl_2$, $BCl_3$, and $CCl_4$, and each of the predetermined gas atmosphere and the second predetermined gas atmosphere includes one or more kinds of gases selected from the group consisting of HCl, $Cl_2$, $BCl_3$, and $CCl_4$.

Preferably, the etching is effected by applying an RF power to a gas atmosphere consisting essentially of one or more kinds of gases selected from the group consisting of HCl, $Cl_2$, $BCl_3$, and $CCl_4$, and each of the predetermined gas atmosphere and the second predetermined gas atmosphere consists essentially of one or more kinds of gases selected from the group consisting of HCl, $Cl_2$, $BCl_3$, and $CCl_4$.

According to a thirty eighth aspect of the present invention, there is provided a thirty eighth plasma processing method as recited in any one of the first to sixteenth methods, wherein the plasma processing is sputtering through use of plasma generated by applying an RF power to a gas atmosphere including one or more kinds of gases selected from the group consisting of Ar, He, Kr and Xe, and each of the predetermined gas atmosphere and the second predetermined gas atmosphere includes one or more kinds of gases selected from the group consisting of Ar, He, Kr and Xe.

Preferably, the sputtering is effected by applying an RF power to a gas atmosphere consisting essentially of one or more kinds of gases selected from the group consisting of Ar, He, Kr and Xe, and each of the predetermined gas atmosphere and the second predetermined gas atmosphere consists essentially of one or more kinds of gases selected from the group consisting of Ar, He, Kr and Xe.

According to a thirty ninth aspect of the present invention, there is provided a thirty ninth plasma processing method as recited in any one of the first to sixteenth methods, wherein the plasma processing is processing for ashing photoresist through use of plasma generated by applying an RF power to a gas atmosphere including one or more kinds of gases selected from the group consisting of $O_2$, $NF_3$, and $H_2O$ gas, and each of the predetermined gas atmosphere and the second predetermined gas atmosphere includes one or more kinds of gases selected from the group consisting of $O_2$, $NF_3$, and $H_2O$ gas.

Preferably, the ashing is effected by applying an RF power to a gas atmosphere consisting essentially of one or more kinds of gases selected from the group consisting of $O_2$, $NF_3$, and $H_2O$ gas, and each of the predetermined gas atmosphere and the second predetermined gas atmosphere consists essentially of one or more kinds of gases selected from the group consisting of $O_2$, $NF_3$, and $H_2O$ gas.

According to a fortieth aspect of the present invention, there is provided a fortieth plasma processing apparatus comprising:

a processing chamber for performing plasma processing for a substrate;

an RF-power applying electrode being capable of applying an RF power to the interior of the processing chamber;

substrate mounting supporting means disposed within the processing chamber;

a gas feed pipe that communicates with the interior of the processing chamber;

an evacuation pipe that communicates with the interior of the processing chamber; and a controller for controlling the plasma processing apparatus such that the controller causes a gas to be fed into the processing chamber through the gas feed pipe and to be evacuated from the chamber through the evacuation pipe so as to control the pressure within the processing chamber at a predetermined pressure, and causes an RF power to be applied to the gas by the electrode so that the substrate placed on the substrate supporting means is subjected to plasma processing for a predetermined time, thereafter the controller causes the application of the RF power to be stopped, then the controller causes a gas to flow into the processing chamber, which gas includes in its structural formula the same atom as the atom included in the structural formula of the plasma processing gas used in the plasma processing.

According to a forty first aspect of the present invention, there is provided a forty first plasma processing method as recited in the fortieth method, wherein the RF-power applying electrode is composed of two electrodes that are disposed parallel to each other within the processing chamber, and the substrate supporting means is disposed on one of the two electrodes, or is the one of the two electrode.

According to a forty second aspect of the present invention, there is provided a forty second plasma processing method as recited in the fortieth or forty first method, further comprising substrate separation means for separating the substrate from the substrate mounting means, wherein the controller controls the plasma processing apparatus such that after stopping the application of the RF power, the controller causes, for a predetermined period of time, a gas to flow, which gas includes in its structural formula the same atom as the atom included in the structural formula of the plasma processing gas used in the plasma processing, and thereafter causes the substrate separation means to separate the substrate from the substrate mounting means.

According to a forty third aspect of the present invention, there is provided a forty third plasma processing method as recited in the fortieth or forty first method, further comprising substrate separation means for separating the substrate from the substrate mounting means, wherein the controller controls the plasma processing apparatus such that the controller causes the gas used in the plasma processing to flow into the processing chamber through the gas feed pipe without stopping the feeding of the plasma processing gas even after the application of the RF power is stopped, and causes the substrate separation means to separate the substrate from the substrate supporting means immediately after the application of the RF power is stopped or after a predetermined period of time has elapsed after completion of the application of the RF power.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
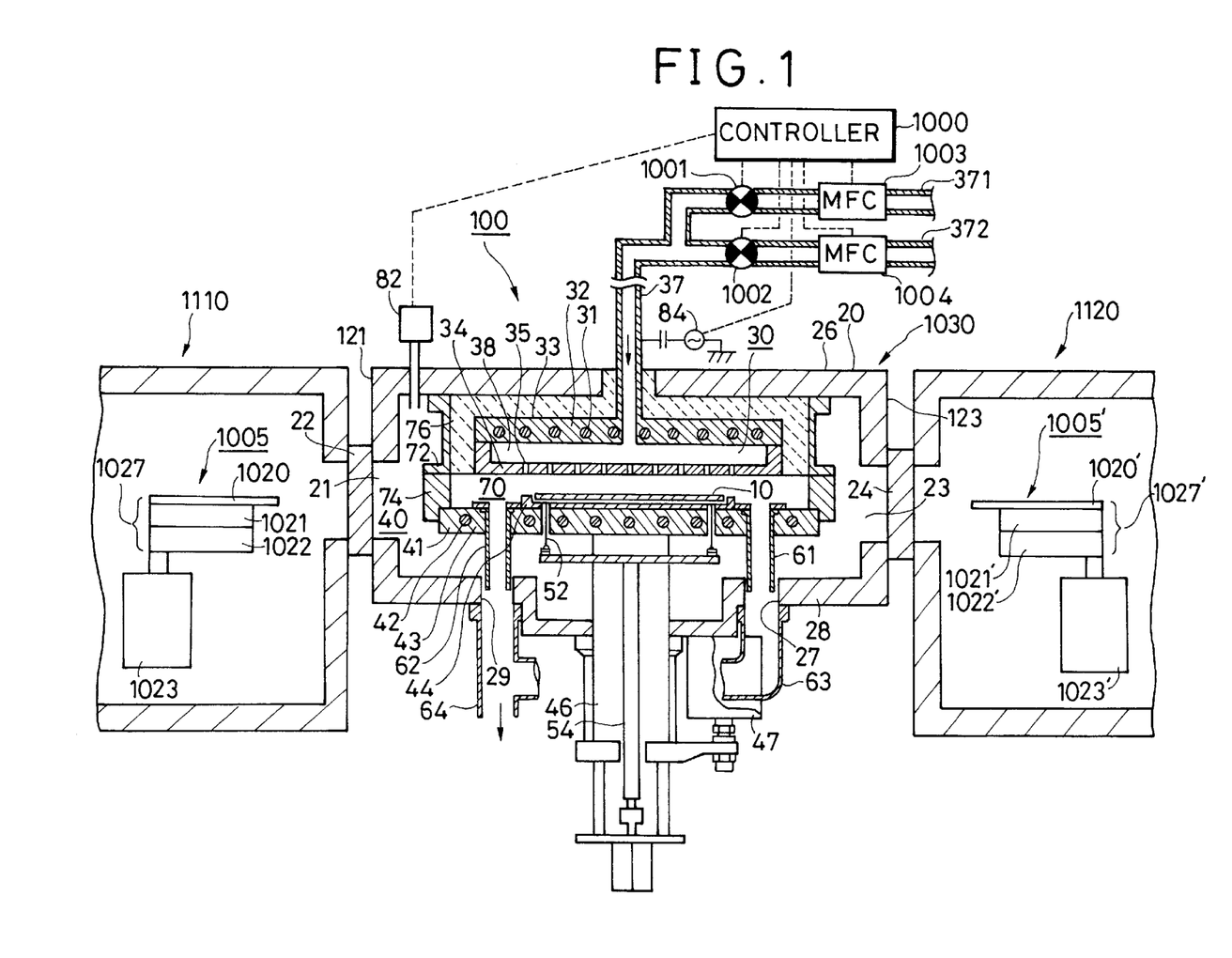
FIG. 1 is a longitudinal sectional view for explaining a plasma enhanced CVD method and a plasma enhanced CVD apparatus according to an embodiment of the present invention.
Figure 2:
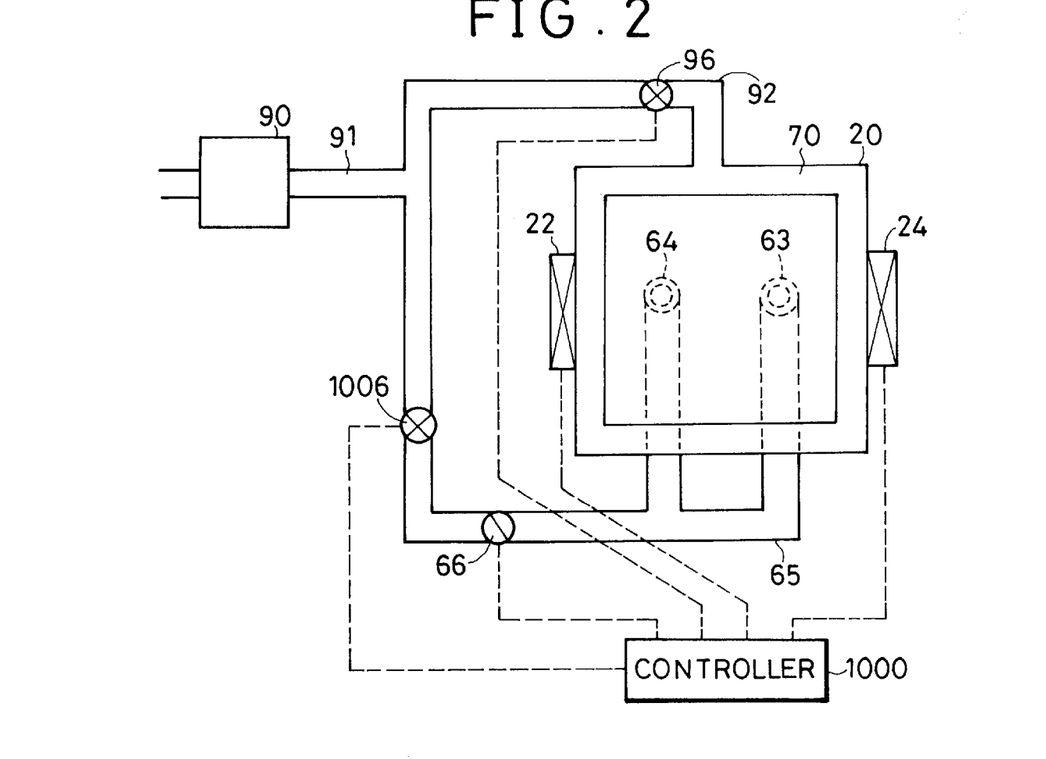
FIG. 2 is a transverse sectional view for explaining the plasma enhanced CVD method and the plasma enhanced CVD apparatus according to the embodiment of the present invention.

An embodiment of the present invention will next be described with reference to the drawings. Referring to FIGS. 1 and 2, a plasma enhanced CVD apparatus 100 of the present embodiment includes a film formation chamber 1030 and substrate transfer chambers 1110 and 1120 located on both sides of the film formation chamber 1030. The film formation chamber 1030 has a 2-chamber structure composed of an outer chamber 20 and an inner chamber 70. The inner chamber 70 functions as a film formation processing chamber and contains a cathode 30 and an anode 40. The cathode 30 includes a cathode heater 32, a shower plate 34, and a reaction gas feed pipe 37.

The reaction gas feed pipe 37 branches out according to the kinds of gases to be used. In the present embodiment, the reaction gas feed pipe 37 branches out into two reaction gas feed pipes 371 and 372. Shut-off valves 1001 and 1002 and mass flow controllers 1003 and 1004 are provided to the reaction gas feed pipes 371 and 372, respectively. This arrangement allows a user to select a reaction gas and to lead the selected reaction gas into the inner chamber 70 while the flow rate of the gas is being controlled.

The cathode heater 32 is composed of sheet-like resistance-heating type heater wires 31 and an aluminum member 33. A plurality of reaction gas dispersion holes 35 are formed in the shower plate 34. A clearance 38 is formed between the cathode heater 32 and the shower plate 34.

The anode 40 includes an anode heater 41 and a substrate table 44 provided on the anode heater 41. The anode heater 41 is composed of sheet-like resistance-heating type heater wires 42 and an aluminum member 43. An RF generator 84 is connected to the cathode 30, and the anode 40 is grounded.

An electrode holder 72 made of SUS is fixed to a top plate 26 of the outer chamber 20. A quartz insulator 76 is disposed inside the electrode holder 72 and fixedly supported thereby. The above-described cathode 30 is located inside the insulator 76, so that the cathode 30 is insulated from the outer chamber 20 by the insulator 76.

An inner-chamber wall 74 made of inconel, aluminum, or SUS is provided along the upper periphery of the anode heater 41 in correspondence with the electrode holder 72.

The anode heater 41 is fixed on a heater drive shaft 46. The anode heater 41 is raised and lowered by rising and lowering the heater drive shaft 46. The heater drive shaft 46 is raised and lowered by an air cylinder 47.

As the anode heater 41 rises, the inner-chamber wall 74 located thereon also rises to abut the electrode holder 72.

Evacuation pipes 61 and 62 are disposed such that they penetrate the anode heater 41. The evacuation pipe 61 is inserted into a hole 27 formed in a bottom plate 28 of the outer chamber 20 and into an evacuation pipe 63. The evacuation pipe 62 is inserted into a hole 29 formed in the bottom plate 28 of the outer chamber 20 and into an evacuation pipe 64. A clearance exists between the evacuation pipe 61 and the inner wall of the hole 27 of the bottom plate 28 and between the evacuation pipe 61 and the inner wall of the evacuation pipe 63. A clearance also exists between the evacuation pipe 62 and the inner wall of the hole 29 of the bottom plate 28 and between the evacuation pipe 62 and the inner wall of the evacuation pipe 64. The evacuation pipes 63 and 64 are connected to a vacuum pump 90 via an evacuation pipe 65. A pressure control valve 66 is provided in the evacuation pipe 65, and a shut-off valve 1006 is also provided in the evacuation pipe 65 downstream of the control valve 66. When a film is formed, a shut-off valve 96, which will be described later, is closed, and the shut-off valve 1006 is opened, to thereby evacuate the inner chamber 70 via the evacuation pipes 61, 63, 62, 64, and 65 and the outer chamber 20 via the clearance between the evacuation pipe 61 and the inner wall of the hole 27 of the bottom plate 28 and between the evacuation pipe 61 and the inner wall of the evacuation pipe 63, the clearance between the evacuation pipe 62 and the inner wall of the hole 29 of the bottom plate 28 and between the evacuation pipe 62 and the inner wall of the evacuation pipe 64, and the evacuation pipes 63, 64, and 65. The pressure control valve 66, which is provided in the evacuation pipe 65, is used to control the internal pressures of the inner and outer chambers 70 and 20, respectively, to a predetermined pressure. The pressure of the plasma enhanced CVD apparatus 100 is measured by a pressure detector 82 provided on the top plate 26 of the outer chamber 20.

Since the space between the outer chamber 20 and the inner chamber 70 is brought into a vacuumed state as described above, heat is prevented from radiating from the inner chamber 70. As a result, since the inner chamber 70 can be maintained in a hot wall state, a product which is likely to exfoliate is not generated on the inner wall of the inner chamber 70, thereby preventing particles from being generated.

The outer chamber 20 has an evacuation pipe 92, which is connected to a high vacuum pump 90 via an evacuation pipe 91. A shut-off valve 96 is provided in the evacuation pipe 92. In operations other than film formation, such as during the transfer of a substrate, the shut-off valve 1006 is closed, and the shut-off valve 96 is opened, to thereby evacuate the interior of the outer chamber 20 via the evacuation pipes 92 and 91. A substrate 10 placed on the substrate table 44 is separated from the substrate table 44 and lifted by substrate elevation pins 52. The substrate elevation pins 52 are affixed to a substrate elevation pin drive shaft 54, which is raised and lowered to raise and lower the substrate elevation pins 52.

A substrate inlet 21 and a substrate outlet 23 are formed in side walls 121 and 123, respectively, of the outer chamber 20. A gate valve 22 is provided at the substrate inlet 21, and a gate valve 24 is provided at the substrate outlet 23.

Substrate transfer chambers 1110 and 1120 accommodate substrate transfer apparatus 1005 and 1005', respectively, for transferring a substrate through the substrate inlet 21 and the substrate outlet 23, respectively, between the substrate table 44 located within the inner chamber 70, in which chamber substrate processing is effected, and a substrate placement section located within another processing chamber (not shown).

Figure 3:
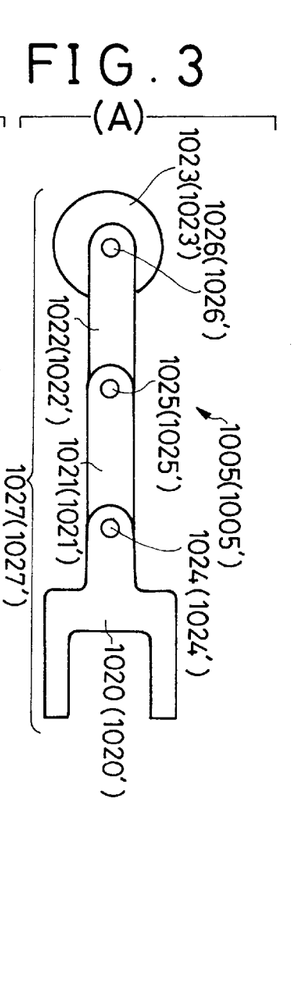
FIGS. 3A and 3B are plan views for explaining a substrate transfer apparatus used in the plasma enhanced CVD apparatus according to the embodiment of the present invention.

Referring to FIG. 3, the substrate transfer apparatus 1005 (1005') of the present embodiment assumes the form of an articulated robot, wherein a robot arm 1027 (1027') is connected to a drive unit 1023 (1023') via a rotary shaft 1026 (1026'). The robot arm 1027 (1027') will now be described in detail. A substrate placement portion 1020 (1020') is linked with a first transfer arm 1021 (1021') via a rotary shaft 1024 (1024'); the first transfer arm 1021 (1021') is linked with a second transfer arm 1022 (1022') via a rotary shaft 1025 (1025'); and the second transfer arm 1022 (1022') is linked with the drive unit 1023 (1023') via the rotary shaft 1026 (1026').

Within the first transfer arm 1021 (1021') and within the second transfer arm 1022 (1022'), pulleys (not shown) are attached to the rotary shafts 1024(1024'), 1025 (1025'), and 1026 (1026'). A drive force is transmitted to the pulleys via belts (not shown) respectively extending along the first transfer arm 1021 (1021') and along the second transfer arm 1022 (1022'). By adjusting the diameter ratio between the pulleys, the robot arm 1027 (1027') becomes extensible and contractible.

A drive motor (not shown) for extending or contracting the robot arm 1027 (1027') is housed within the drive unit 1023 (1023') and connected to the rotary shaft 1026 (1026'). This drive motor is run independently of the rotary shaft 1026 (1026') so as to turn the robot arm 1027 (1027') to thereby change a direction along which the robot arm 1027 (1027') is to be extended or contracted.

Figure 4:
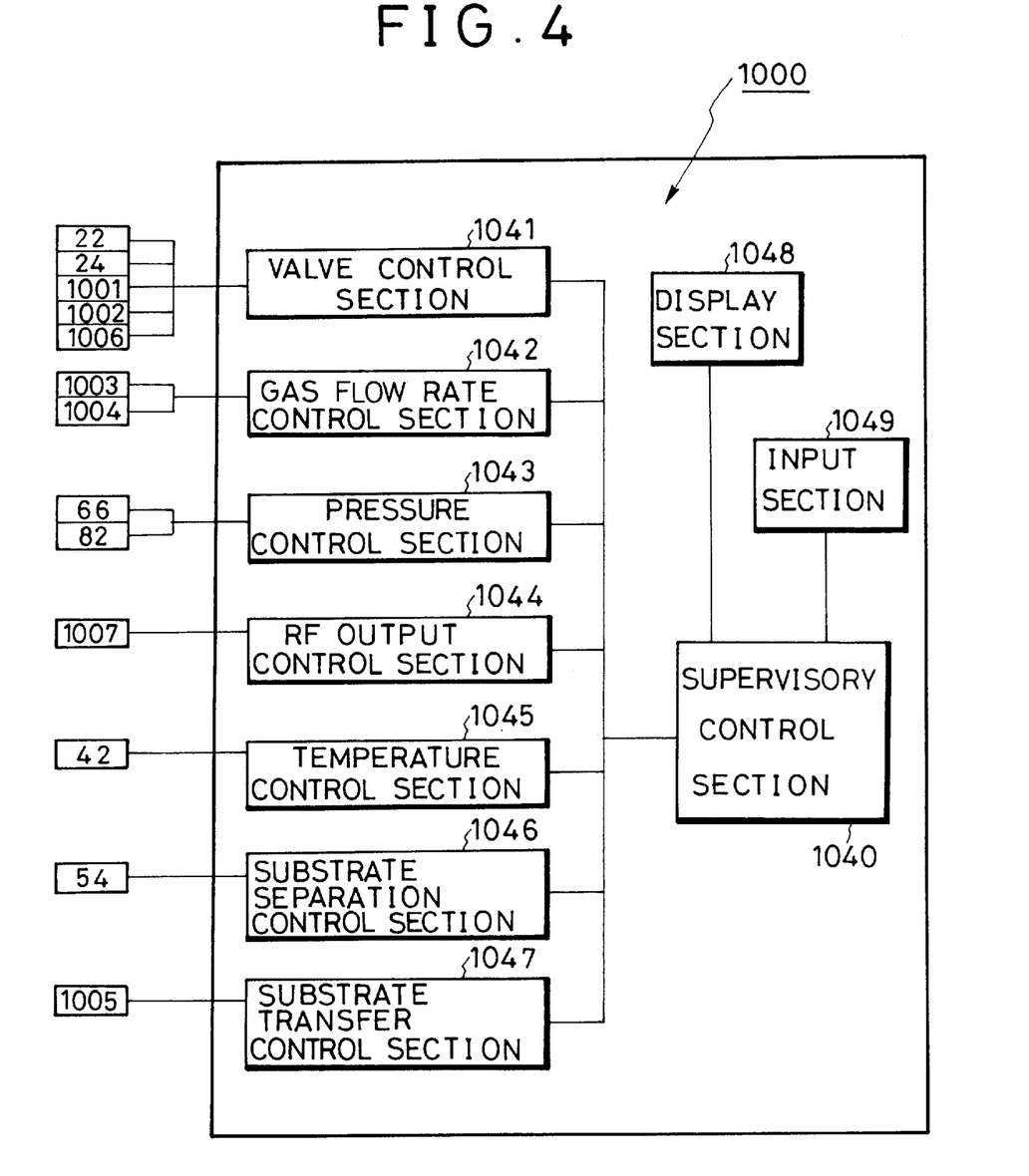
FIG. 4 is a block diagram for explaining a controller of the plasma enhanced CVD apparatus according to the embodiment of the present invention.

Referring to FIG. 4, in the controller 1000, a valve control section 1041, a gas flow rate control section 1042, a pressure control section 1043, an RF output control section 1044, a temperature control section 1045, a substrate separation control section 1046, and a substrate transfer control section 1047 are connected to a supervisory control section 1040 in accordance with required functions. A display section 1048 with which a worker visually checks the control conditions of the apparatus and the state of setting, and an input section 1049 for changing control conditions and set values are also connected to the supervisory control section 1040. The input section 1049 may be a keyboard from which a worker enters data manually, or an apparatus which automatically reads data from a storage medium such as a floppy disk or an IC card.

The valve control section 1041 is connected to the shut-off valves 1001 and 1002 so as to respectively block or unblock, as needed, the gas feed pipes 371 and 372 to thereby select a gas to be fed into the apparatus. Further, the valve control section 1041 is connected to the shut-off valves 1006 and 96 so as to respectively block or unblock, as needed, the evacuation pipes 65 and 92. The valve control section 1041 is also connected to the gate valves 22 and 24 so as to open or close, as needed, the substrate inlet 22 and the substrate outlet 24, respectively.

The gas flow rate control section 1042 is connected to the mass flow controllers 1003 and 1004 so as to respectively control the degree of a valve opening of the mass flow controllers 1003 and 1004 to thereby control the amount of a gas to be fed per unit time.

The pressure control section 1043 is connected to the pressure control valve 66 and the pressure detector 82 so as to control the degree of the valve opening of the pressure control valve 66 based on a pressure detected by the pressure detector 82 to thereby control the amount of a gas to be evacuated per unit time.

The RF output control section 1044 is connected to the RF generator 84 so as to control the RF power supplied by the RF generator 84 and also to start and stop the application of the RF power.

The temperature control section 1045 is connected to the heater wires 42 and a thermocouple (not shown) for detecting the temperature of the anode heater 41 so as to set the heater temperature and to control the electric energy supplied to the anode heater 41 based on the result of comparison between the set heater temperature and the temperature detected by the thermocouple.

The substrate separation control section 1046 is connected to the substrate elevation pin drive shaft 54 so as to control the placement of the substrate 10 on and the separation of the substrate 10 from the substrate table 44 through a vertical movement of the substrate elevation pin drive shaft 54.

The substrate transfer control section 1047 is connected to the substrate transfer apparatus 1005 (1005') so as to control the transfer of a substrate into and out of the film formation chamber 1030.

The supervisory control section 1040 allows a user to enter thereinto a recipe for carrying out sequence control. The supervisory control section 1040 issues instructions in accordance with the entered recipe to the valve control section 1041, the gas flow rate control section 1042, the pressure control section 1043, the RF output control section 1044, the temperature control section 1045, the substrate separation control section 1046, and the substrate transfer control section 1047. Further, the supervisory control section 1040 is provided with a interlocked system which functions in various ways. For example, when the gate valves 22, 24 are not opened or when the anode heater 41 is not lowered and thus the inner-chamber wall 74 is not lowered, the substrate transfer apparatus 1005 (1005') is inhibited from transferring a substrate into (out of) the film formation chamber 1030. Also, no operation is allowed to be initiated against an erroneous instruction.

Figure 5:
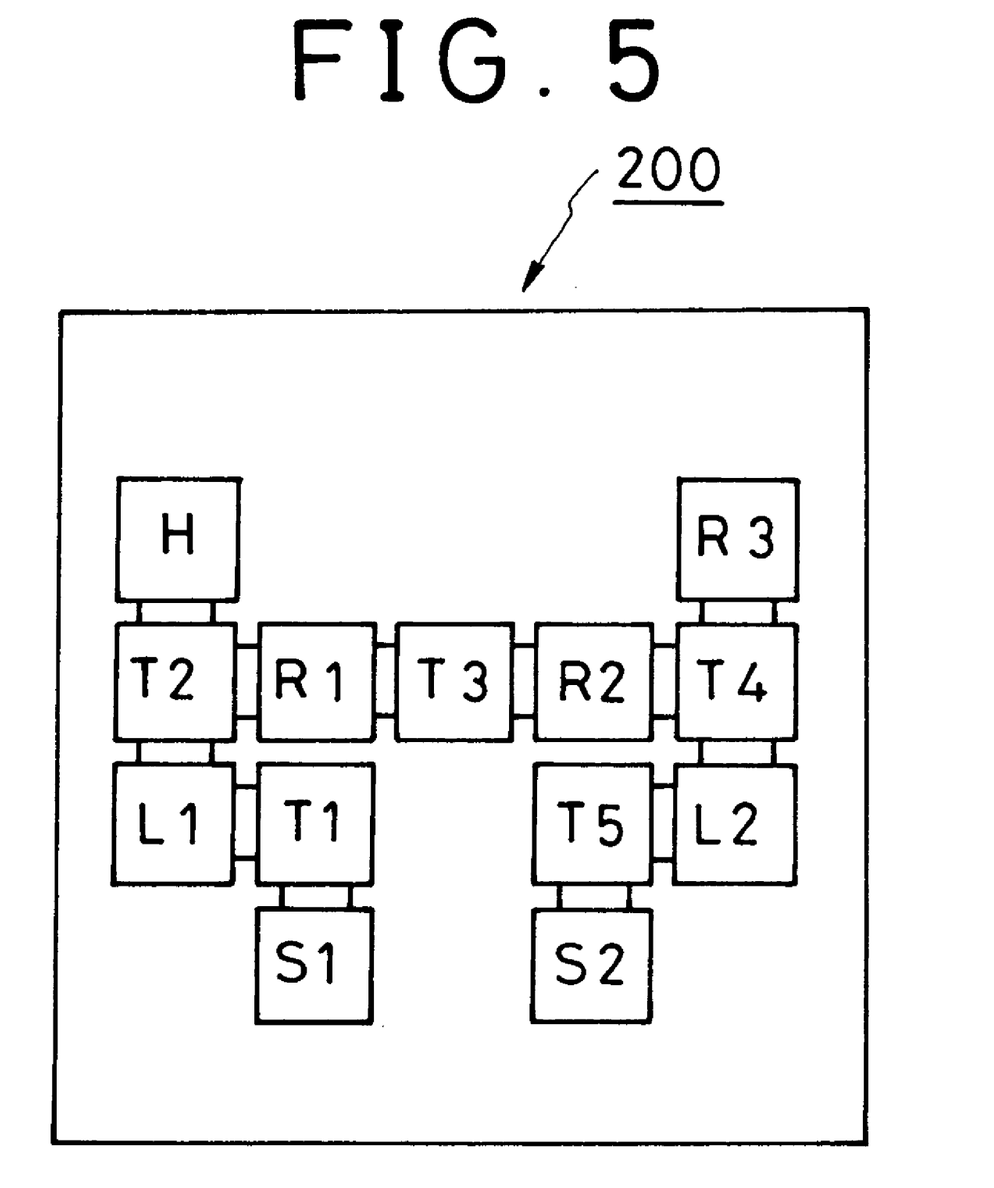
FIG. 5 is a block diagram for explaining a single substrate processing type plasma enhanced CVD apparatus for LCDs to which the plasma enhanced CVD method and the plasma enhanced CVD apparatus according to the embodiment of the present invention is applied.

Referring to FIG. 5, a single substrate processing type plasma enhanced CVD apparatus for LCDs 200 includes cassette stands S1 and S2, transfer robots T1 and T5 designed for use under atmospheric pressure, transfer robots T2, T3, and T4 designed for use under vacuum, load-lock chambers L1 and L2, film formation chambers R1, R2, and R3, and a substrate heating chamber H. The plasma processing method and the plasma processing apparatus of the present invention are applied to processing in the film formation chambers R1, R2, and R3.

A cassette (not shown) which normally accommodates up to 20 glass substrates is placed on the cassette stand S1. The atmospheric-use transfer robot T1 transfers a single glass substrate from the cassette (not shown) placed on the cassette stand S1 to the load lock chamber L1. Subsequently, the load-lock chamber L1 is evacuated to establish a vacuum therein from the atmospheric pressure, and then the vacuum-use transfer robot T2 transfers the glass substrate into the substrate heating chamber H. The glass substrate is heated to a film formation temperature in the substrate heating chamber H, and subsequently the vacuum-use transfer robot T2 transfers the heated glass substrate into the film formation chamber R1. Subsequently, a film is formed on the glass substrate in the film formation chamber R1. The thus-processed glass substrate (not shown) is lifted off a substrate table (not shown) by the substrate separation step(s) of the plasma processing method of the present invention, and then is transferred into the film formation chamber R2 by the vacuum-use transfer robot T3. Likewise, a film forming process is performed in the film formation chamber R2. The thus-processed glass substrate (not shown) is lifted off the substrate table (not shown) by the substrate separation step(s) of the plasma processing method of the present invention, and then is transferred into the film formation chamber R3 by the vacuum-use transfer robot T4. Also, in the film formation chamber R3, a film forming process is performed in the same manner as in the film formation chamber R1. The thus-processed glass substrate (not shown) is lifted off a substrate table (not shown) by the substrate separation step(s) of the plasma processing method of the present invention, and then is transferred into the load-lock chamber L2 by the vacuum-use transfer robot T4. The thus-processed glass substrate is cooled in the load-lock chamber L2, and the load-lock chamber L2 is brought back to the atmospheric pressure. Subsequently, the processed glass substrate is transferred into a cassette (not shown) placed on the cassette stand S2 by the atmospheric-use transfer robot T5.

Figure 6:
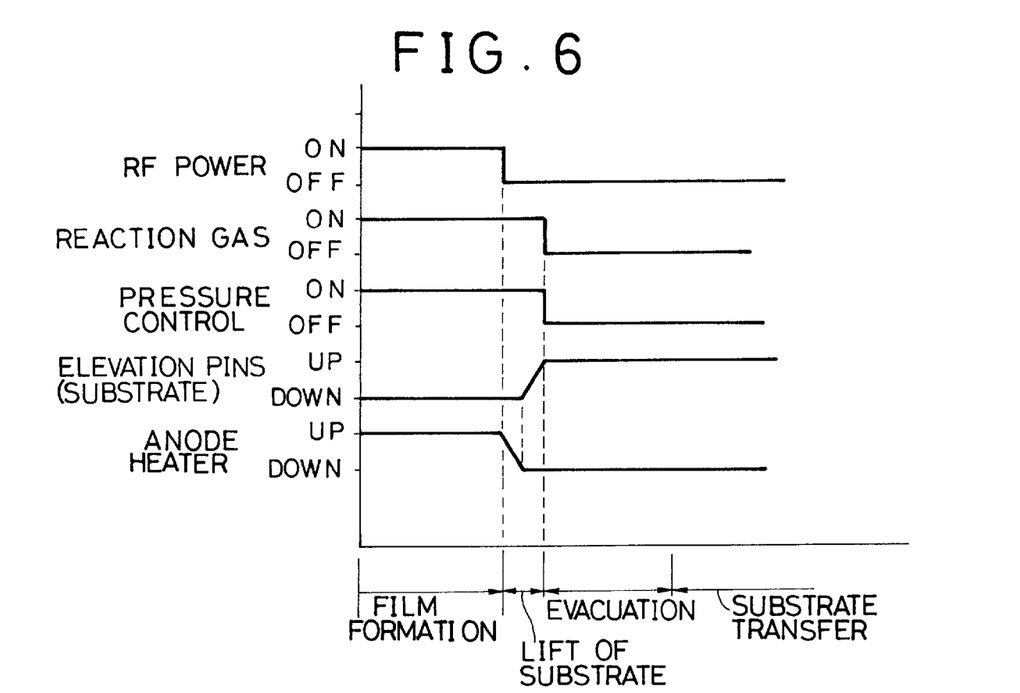
FIG. 6 is a sequence diagram for explaining the plasma enhanced CVD method according to the embodiment of the present invention.

FIG. 6 is a sequence diagram for explaining the plasma enhanced CVD method according to the embodiment of the present invention.

First, the substrate 10 is placed on the substrate table 44, and the anode heater 41 is raised. In this state, while the inner chamber 70 is being evacuated at a predetermined rate of evacuation by the high vacuum pump 90 via the evacuation pipes 61, 62, 63, 64, and 65, and the pressure control valve 66, a reaction gas is led into the inner chamber 70 at a predetermined flow rate via the reaction gas feed pipe 37 to thereby control the pressure of the inner chamber 70 to a predetermined value, and an RF power is applied between the cathode 30 and the anode 40 by the RF generator 84 so as to generate plasma to thereby form a film on the substrate 10. The reaction gas is fed through the reaction gas feed pipe 37, flows into the clearance 38 between the cathode heater 32 and the shower plate 34, and then flows toward the substrate 10 through the reaction gas dispersion holes 35 formed in the shower plate 34. The thus-fed reaction gas is then evacuated from the inner chamber 70 via the evacuation pipes 61 and 62.

After the elapse of a predetermined period of time required for film formation, the application of the RF power is terminated, but the feed and evacuation of the reaction gas and the pressure control for the inner chamber 70 are continued. In this case, preferably, the reaction gas is the same as that used during film formation, and is fed at the same flow rate as that during film formation. Also, preferably, the rate of evacuation of the inner chamber 70 is the same as that during film formation, and thus the inner chamber 70 is controlled to the same pressure as that during film formation. This state can be readily established merely by shutting off the RF power.

In this state, the anode heater 41 is lowered, and subsequently the substrate elevation pins 52 are raised to lift the substrate 10 off the substrate table 44.

After the substrate 10 is lifted, the reaction gas is shut off, the pressure control of the inner chamber 70 is terminated, and the inner chamber 70 and the outer chamber 20 are evacuated to a high vacuum.

Subsequently, the substrate transfer apparatus 1005' transfers the substrate 10 through the substrate outlet 23 into the substrate transfer chamber 1120, from which the substrate 10 is then transferred into the next processing chamber.

By exposing the substrate 10 to a reaction gas atmosphere with the RF power being shut off as described above, an electrification-induced charge which was established in the substrate 10 during forming a film through use of plasma is reduced or removed. Further, by lifting the substrate 10 off the substrate table 44 in the reaction gas atmosphere, the charge established in the substrate 10 can be effectively removed, and further establishment of a charge in the substrate 10 is suppressed or prevented. Thus, the substrate 10 can be transferred in a less charged state. As a result, a substrate transfer error can be effectively prevented which would otherwise been caused by the following: the substrate 10 remains adhered to the adjacent shower plate 34 while being transferred; the substrate 10 once adheres to the shower plate 34 and subsequently drops onto the substrate table 44; and the dropped substrate 10 breaks. Also, a dielectric breakdown can be effectively prevented which would otherwise been caused by the following reasons: the substrate 10 sparks to a nearby grounded site, causing a formed film and a device pattern to be blown out with a resultant pattern defect.

Figure 7:
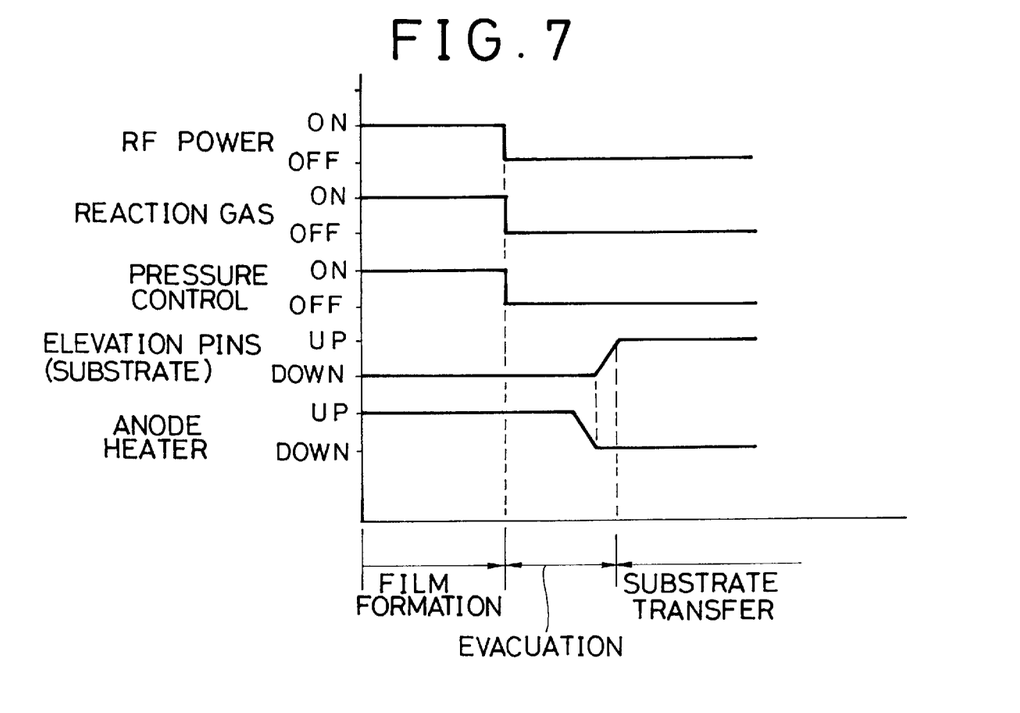
FIG. 7 is a sequence diagram for explaining a comparative plasma enhanced CVD method.

FIG. 7 is a sequence diagram for explaining a comparative plasma enhanced CVD method. First, the substrate 10 is placed on the substrate table 44, and the anode heater 41 is raised. In this state, while the inner chamber 70 is being evacuated at a predetermined rate of evacuation by the high vacuum pump 90 via the evacuation pipes 61, 62, 63, 64, and 65 and the pressure control valve 66, a reaction gas is led into the inner chamber 70 at a predetermined flow rate via the reaction gas feed pipe 37 to thereby control the pressure of the inner chamber 70 to a predetermined value, and an RF power is applied between the cathode 30 and the anode 40 by the RF generator 84 so as to generate plasma to thereby form a film on the substrate 10. After the elapse of a predetermined period of time required for film formation, the application of the RF power, the feed and evacuation of the reaction gas, and the pressure control of the inner chamber 70 are simultaneously terminated, and the inner chamber 70 is evacuated to establish a high vacuum therein. After the interior of the inner chamber 70 reaches a predetermined degree of vacuum, the anode heater 41 is lowered, and subsequently the substrate elevation pins 52 are raised to lift the substrate 10 off the substrate table 44. Subsequently, the substrate transfer apparatus 1005' transfers the substrate 10 through the substrate outlet 23 into the substrate transfer chamber 1120, from which the substrate 10 is then transferred into the next processing chamber.

After film formation, when the substrate 10 was transferred by the substrate separation step(s) of the comparative plasma enhanced CVD method, a substrate transfer error occurred in some cases due to the following causes: the substrate 10 remained adhered to the adjacent shower plate 34 while being transferred; the substrate 10 once adhered to the shower plate 34 and subsequently dropped onto the substrate table 44; and the dropped substrate 10 broke. Also, in some cases, a so-called dielectric breakdown, wherein an insulated portion is broken down, occurred due to the following reason: the substrate 10 sparked to a nearby grounded site, causing a formed film and a device pattern to be blown out with a resultant pattern defect. Because of the occurrence of the substrate transfer error and the dielectric breakdown, the operation sequence of the comparative plasma enhanced CVD method failed to provide a stable film formation process.

The inventors of the present invention have carried out extensive studies, and as a result, have come to think that the above-described substrate transfer error and dielectric breakdown are caused by a charge established in the substrate 10 by plasma discharge while a film is being formed, as well as by a charge established in a substrate by separation electrification which takes place when the substrate 10 is separated from the substrate table 44. That is, when the substrate 10, which has already been charged on the substrate table 44 by plasma discharge conducted to form a film thereon, is lifted off the substrate table 44 under high vacuum, a separation electrification occurs, which further increases the electric potential of the charged substrate 10. This electrification-induced electric potential increases as the speed of the substrate elevation pins 52 increases. By contrast, as the speed of the substrate elevation pins 52 decreases, the electrification-induced electric potential is suppressed accordingly. As described above, since the substrate 10 is charged during film formation process utilizing plasma and the electrification-induced electric potential established in the substrate 10 increases due to the separation-electrification, a strong static electricity is generated, so that the substrate 10 remains electrostatically adhered to the adjacent shower plate 34 while being transferred, the substrate 10 electrostatically once adheres to the shower plate 34 and subsequently drops onto the substrate table 44, or the dropped substrate 10 breaks, thereby causing a transfer error. Moreover, since the charge established in the substrate 10 tends to escape to a nearby grounded site, the substrate 10 sparks to the nearby grounded site. Such a spark blows out a part of a formed film or a device pattern, resulting in pattern missing. This leads to a so-called dielectric breakdown wherein an insulated portion breaks down. These problems were solved by employing the above-described operation sequence of the plasma enhanced CVD method according to the embodiment of the present invention.

EXAMPLES

Examples of the present invention and a comparative example will now be described with reference to FIGS. 1, 2, 6, and 7.

First Example

The plasma enhanced CVD apparatus 100 shown in FIGS. 1 and 2 was used. The glass substrate 10 was placed on the substrate table 44, and the anode heater 41 was raised. In this state, while the inner chamber 70 was being evacuated at a predetermined rate of evacuation by the high vacuum pump 90 via the evacuation pipes 61, 62, 63, 64, and 65 and the pressure control valve 66, reaction gases. $SiH_4$ and $N_2O$ were led into the inner chamber 70 at a predetermined flow rate via the reaction gas feed pipe 37 to thereby control the pressure of the inner chamber 70 to a pressure of 0.2 to 1.5 Torr, and an RF power of 340 W at 13.56 MHz was applied between the cathode 30 and the anode 40 by the RF generator 84 so as to generate plasma to thereby form an $SiO_2$ film on the glass substrate 10.

After the elapse of a predetermined period of time required for film formation, the application of the RF power was terminated, but the feed and evacuation of the reaction gases and the pressure control for the inner chamber 70 are continued. In this case, the reaction gases were the same as those used during film formation, and were fed at the same flow rate as that during film formation. The rate of evacuation of the inner chamber 70 was also the same as that during film formation, and the internal pressure of the inner chamber 70 was controlled to the same pressure as that during film formation.

In this state, the anode heater 41 was lowered immediately after the RF power was shut off, and subsequently the substrate elevation pins 52 were raised to lift the glass substrate 10 off the substrate table 44. In this case, it took the anode heater 41 about 1 to 2 seconds to complete lowering, and it also took the substrate elevation pins 52 about 1 to 2 seconds to complete rising.

After the glass substrate 10 was lifted, the reaction gases were shut off, the pressure control for the inner chamber 70 was terminated, and the inner chamber 70 and the outer chamber 20 were evacuated to a high vacuum.

Subsequently, the substrate transfer robot 1005' was operated to transfer the glass substrate 10 through the substrate outlet 23 into the substrate transfer chamber 1120. After that, the surface potential of the glass substrate 10 was measured.

By contrast, in the Comparative Example, as shown in FIG. 7, after the elapse of a predetermined period of time required for forming the SiO$_2$ film, the application of the RF power, the feed of the reaction gases, and the pressure control for the inner chamber 70 were simultaneously terminated, and the inner chamber 70 was evacuated to establish a high vacuum therein.

In this state, the anode heater 41 was lowered, and subsequently the substrate elevation pins 52 were raised to lift the glass substrate 10 off the substrate table 44.

After the glass substrate 10 was lifted, the substrate transfer robot 1005' was operated to transfer the glass substrate 10 through the substrate outlet 23 into the substrate transfer chamber 1120. After that, the surface potential of the glass substrate 10 was measured.

Then, the surface potential measurements were compared between the glass substrate 10 on which the film was formed in accordance with the sequence of the First Example and the glass substrate 10 on which the film was formed in accordance with the sequence of the Comparative Example.

Film formation was conducted in accordance with the sequence of the First Example and in accordance with the sequence of the Comparative Example, on 20 glass substrates 10 each. The thus-processed glass substrates 10 were measured for a surface potential. The measurements were shown in Table 1.

TABLE 1

|  | First substrate | Second substrate | Third substrate | ... | 20th substrate |
|---|---|---|---|---|---|
| Sequence of First Example | −0.2 kV | −0.3 kV | −0.1 kV | ... | −0.2 kV |
| Sequence of Comparative Example | −2 kV or less | −2 kV or less | −2 kV or less | ... | −2 kV or less |

As seen from the table, the glass substrates 10 processed in accordance with the sequence of the Comparative Example show a surface potential of not more than −2 kV. By contrast, the glass substrates 10 processed in accordance with the sequence of the First Example show a surface potential of not less than −0.3 kV, indicating an apparent reduction in the surface potential.

Similar results were also obtained at different pressures of the inner chamber 70 as well as at different flow rates of reaction gases. A partial missing of a device pattern, which was caused by a partial insulation breakdown, was observed with some substrates processed in accordance with the sequence of the Comparative Example. On the other hand, any missing of a device pattern was not observed with the substrates processed in accordance with the sequence of the First Example.

Second to Tenth Examples

Next will be described Second to Tenth Examples wherein plasma processing was conducted through use of various reaction gases in accordance with first to third sequences described below.

The first to third sequences will now be described with reference to FIGS. 1, 2, and 6.

First Sequence

The plasma enhanced CVD apparatus 100 was used. The glass substrate 10 was placed on the substrate table 44, and the anode heater 41 was raised. In this state, while the inner chamber 70 was being evacuated at a predetermined rate of evacuation by the high vacuum pump 90 via the evacuation pipes 61, 62, 63, 64, and 65 and the pressure control valve 66, a reaction gas or reaction gases were led into the inner chamber 70 at a predetermined flow rate via the reaction gas feed pipe 37 to thereby control the pressure of the inner chamber 70 to a pressure of 0.2 to 1.5 Torr, and an RF power of 340 W at 13.56 MHz was applied between the cathode 40 and the anode 40 by the RF generator 84 so as to generate plasma to thereby conduct a plasma processing on the glass substrate 10.

After the elapse of a predetermined period of time required for the plasma processing, the application of the RF power was terminated, but the feed and evacuation of the reaction gases and the pressure control for the inner chamber 70 are continued. In this case, the reaction gases were the same as those used during the plasma processing, and were fed at the same flow rate as that during the plasma processing. The rate of evacuation of the inner chamber 70 was also the same as that during the plasma processing, and the inner chamber 70 was controlled to the same pressure as that during the plasma processing.

In this state, the anode heater 41 was lowered immediately after the RF power was shut off, and subsequently the substrate elevation pins 52 were raised to lift the glass substrate 10 off the substrate table 44. In this case, it took the anode heater 41 about 1 to 2 seconds to complete lowering, and it also took the substrate elevation pins 52 about 1 to 2 seconds to complete rising.

After the glass substrate 10 was lifted, the reaction gases were shut-off, the pressure control of the inner chamber 70 was terminated, and the inner chamber 70 and the outer chamber 20 were evacuated to a high vacuum.

Subsequently, the substrate transfer robot 1005' was operated to transfer the glass substrate 10 through the substrate outlet 23 into the substrate transfer chamber 1120. After that, the surface potential of the glass substrate 10 was measured.

Second Sequence

A procedure up to plasma processing is the same as that of the First Sequence, and thus the description thereof is omitted.

After the elapse of a predetermined period of time required for the plasma processing, the application of the RF power was terminated, and at the same time, the feed and evacuation of the reaction gases and the pressure control of the inner chamber 70 were terminated. Also, immediately after the application of the RF power was terminated, the anode heater 41 was lowered. Subsequently, the substrate elevation pins 52 were raised to lift the glass substrate 10 off the substrate table 44. In this case, it took the anode heater 41 about 1 to 2 seconds to complete lowering, and it also took the substrate elevation pins 52 about 1 to 2 seconds to complete rising.

After the glass substrate 10 was lifted, the inner chamber 70 and the outer chamber 20 were evacuated to a high vacuum.

A subsequent procedure is the same as that of the First Sequence, and thus the description thereof is omitted.

Third Sequence

A procedure up to plasma processing is the same as that of the First Sequence, and thus the description thereof is omitted.

After the elapse of a predetermined period of time required for the plasma processing, the application of the RF power was terminated, and the evacuation of the reaction gases and the pressure control for the inner chamber 70 were terminated, but the feed of the reaction gases was continued. Also, immediately after the application of the RF power was terminated, the anode heater 41 was lowered. Subsequently, the substrate elevation pins 52 were raised to lift the glass substrate 10 off the substrate table 44. In this case, it took the anode heater 41 about 1 to 2 seconds to complete lowering, and it also took the substrate elevation pins 52 about 1 to 2 seconds to complete rising.

After the glass substrate 10 was lifted, the reaction gases were shut off, and the inner chamber 70 and the outer chamber 20 were evacuated to a high vacuum.

A subsequent procedure is the same as that of the First Sequence, and thus the description thereof is omitted.

Next will be described the Second to Tenth Examples which were conducted in accordance with the above-described First to Third Sequences.

Second Example

Through use of either $SiH_4$ or $Si_2H_6$ (30 to 100 SCCM) and one of $N_2O$, $CO_2$, CO, and $O_2$ (300 to 700 SCCM) as reaction gases, a silicon oxide film was formed in accordance with the above-described First to Third Sequences.

Third Example

Through use of one of $SiH_4$, $Si_2H_6$, $SiF_4$, $SiH_2Cl_2$, and $Si_2F_6$ (50 to 100 SCCM) and one of $NH_3$, $N_2$, and $NF_3$ (100 to 400 SCCM) as reaction gases, and one of $N_2$, Ar, He, and $H_2$ (1 SLM) as a carrier gas, a silicon nitride film was formed in accordance with the above-described First to Third Sequences.

Fourth Example

Through use of either $SiH_4$ or $Si_2H_6$ (50 to 200 SCCM) and a $PH_3$ (100 to 500 SCCM) as reaction gases, an $n^+$-amorphous silicon film was formed in accordance with the above-described First to Third Sequences.

Fifth Example

Through use of either $SiH_4$ or $Si_2H_6$ (50 to 200 SCCM) as a reaction gas, an amorphous silicon film was formed in accordance with the above-described First to Third Sequences.

Sixth Example

Through use of one of $F_2$, $SF_6$, $NF_3$, $CF_4$, $C_2F_6$, $C_3F_8$, $CHF_3$, HCl, $Cl_2$, $BCl_3$, and $CCl_4$ (100 to 1000 SCCM) and one of $H_2$, He, $N_2$, $O_2$, $NH_3$, and CO (100 to 1000 SCCM) as reaction gases, silicon oxide film, silicon nitride film, amorphous silicon film, $n^+$-amorphous silicon film, single crystal silicon film, or polycrystalline silicon film was etched in accordance with the above-described First to Third Sequences. For etching, the internal pressure of the inner chamber 70 was controlled to a pressure of 0.1 to 10 Torr, and an RF power of 200 W to 10 kW was applied.

Seventh Example

Through use of HI (hydrogen iodide) gas (100 to 1000 SCCM) as a reaction gas, an ITO (Indium Tin Oxide) film was etched in accordance with the above-described First to Third Sequences. For etching, the internal pressure of the inner chamber 70 was controlled to a pressure of 0.1 to 10 Torr, and an RF power of 200 W to 10 kW was applied.

Eighth Example

Through use of one of HCl, $Cl_2$, $BCl_3$, and $CCl_4$ (100 to 1000 SCCM) as reaction gases, an Al film was etched in accordance with the above-described First to Third Sequences. For etching, the internal pressure of the inner chamber 70 was controlled to a pressure of 0.1 to 10 Torr, and an RF power of 200 W to 10 kW was applied.

Ninth Example

Through use of one of Ar, He, Kr, and Xe (100 to 1000 SCCM), and Al as a target, sputtering was conducted in accordance with the above-described First to Third Sequences. For sputtering, the internal pressure of the inner chamber 70 was controlled to a pressure of about 0.1 Torr, and an RF power of 200 W to 10 kW was applied.

Tenth Example

Through use of an $O_2$, $NF_3$, or $H_2O$ gas (100 to 1000 SCCM) as a reaction gas, a photoresist was ashed in accordance with the above-described First to Third Sequences. For etching, the internal pressure of the inner chamber 70 was controlled to a pressure of 0.1 to 10 Torr, and an RF power of 200 W to 10 kW was applied.

In the Second to Tenth Examples of the present invention, the surface potential of the plasma-processed glass substrates 10 was maintained equal to or greater than −0.3 kV (i.e., the absolute value of the potential was maintained equal to or less than 0.3 kV). This indicates that charges were effectively removed.

What is claimed is:

1. A plasma processing method, comprising steps of:
   forming a silicon oxide film on a substrate placed on a substrate table in a processing chamber through plasma generation by applying an RF power while feeding a gas comprising $SiH_4$ and $N_2O$ into said processing chamber;
   separating said substrate from said substrate table while feeding at least said gas comprising $SiH_4$ and $N_2O$ into said processing chamber with the application of the RF power being stopped; and
   removing said substrate from said processing chamber, whereby substrate transfer error or dielectric breakdown of the substrate is avoided.

2. The plasma processing method as recited in claim 1, further comprising:

evacuating said processing chamber after separating said substrate from said substrate table and before removing said substrate from said processing chamber.

3. The plasma processing method as recited in claim 1, wherein said separating step comprises separating said substrate from said substrate table while feeding said gas comprising $SiH_4$ and $N_2O$ into said processing chamber with the application of the RF power being stopped.

4. The plasma processing method as recited in claim 1, wherein said forming step comprises forming said silicon oxide film on the substrate placed on the substrate table in the processing chamber through plasma generation by applying the RF power while feeding a gas consisting essentially of $SiH_4$ and $N_2O$ into said processing chamber; and said separating step comprises separating said substrate from said substrate table while feeding said gas consisting essentially of $SiH_4$ and $N_2O$ into said processing chamber with the application of the RF power being stopped.

5. The plasma processing method as recited in claim 1, wherein said separating step comprises separating said substrate from said substrate table while feeding into said processing chamber the same gas as the gas fed into said processing chamber during said plasma processing, with the application of the RF power being stopped.

6. The plasma processing method as recited in claim 1, wherein said forming step and said separating step are effected at a same pressure one to the other.

7. The plasma processing method as recited in claim 1, wherein a flow rate of said gas during said forming step and a flow rate of said gas during said separating step are the same one to the other.

8. The plasma processing method as recited in claim 1, wherein the pressure within said processing chamber is from 0.2–1.5 Torr during said separating step.

9. A plasma processing method, comprising steps of:
forming a silicon oxide film on a substrate placed on a substrate table in a processing chamber through plasma generation by applying an RF power in a first gas atmosphere comprising $SiH_4$ and $N_2O$;
separating said substrate from said substrate table in a second gas atmosphere comprising $SiH_4$ and $N_2O$ with the application of the RF power being stopped; and
removing said substrate from said processing chamber, whereby substrate transfer error or dielectric breakdown of the substrate is avoided.

10. The plasma processing method as recited in claim 9, further comprising a step of evacuating said processing chamber after said separating step and before removing said substrate from said processing chamber.

11. The plasma processing method as recited in claim 9, wherein said second gas atmosphere is identical to said first atmosphere.

12. The plasma processing method as recited in claim 9, wherein said step of forming said silicon oxide film comprises forming the silicon oxide film on the substrate placed on the substrate table in the processing chamber through plasma generation by applying the RF power in a gas atmosphere consisting essentially of $SiH_4$ and $N_2O$, and said separating step comprises separating said substrate from said substrate table in said gas atmosphere consisting essentially of $SiH_4$ and $N_2O$ with the application of the RF power being stopped.

13. The plasma processing method as recited in claim 9, wherein said separating step comprises separating said substrate from said substrate table in the same gas atmosphere as that of the step of forming said silicon oxide film.

14. A plasma processing method comprising steps of:
forming a silicon oxide film on a substrate placed on a substrate table in a processing chamber through plasma generation by applying an RF power while feeding a gas comprising a gas represented by a structural formula $Si_nH_{2n+2}$, where n is an integer equal to or greater than 1, and a gas consisting essentially of at least one gas selected from the group consisting of $N_2O$, $CO_2$, CO, and $O_2$;
separating said substrate from said substrate table while feeding at least said gas comprising the gas represented by the structural formula $Si_nH_{2n+2}$ and the gas consisting essentially of one or more of gases selected from the group consisting of $N_2O$, $CO_2$, CO, and $O_2$; and
removing said substrate from said processing chamber, whereby substrate transfer error or dielectric breakdown of the substrate is avoided.

15. The plasma processing method as recited in claim 14, further comprising a step of evacuating said processing chamber after said separating step and before removing said substrate from said processing chamber.

16. The plasma processing method as recited in claim 14, wherein said separating step comprises separating said substrate from said substrate table while feeding said gas comprising the gas represented by the structural formula $Si_nH_{2n+2}$ and the gas consisting essentially of at least one gas selected from the group consisting of $N_2O$, $CO_2$, CO, and $O_2$, into said processing chamber with the application of the RF power being stopped.

17. The plasma processing method as recited in claim 14, wherein said forming step comprises forming said silicon oxide film on the substrate placed on the substrate table in the processing chamber through plasma generation by applying the RF power while feeding the gas represented by the structural formula $Si_nH_{2n+2}$ and the gas consisting essentially of at least one gas selected from the group consisting of $N_2O$, $CO_2$, CO, and $O_2$, into said processing chamber; and said separating step comprises separating said substrate from said substrate table while feeding the gas represented by the structural formula $Si_nH_{2n+2}$ and the gas consisting essentially of at least one gas selected from the group consisting of $N_2O$, $CO_2$, CO, and $O_2$, into said processing chamber with the application of the RF power being stopped.

18. The plasma processing method as recited in claim 14, wherein said separating step comprises separating said substrate from said substrate table while feeding into said processing chamber the same gas as the gas fed into said processing chamber during said plasma processing, with the application of the RF power being stopped.

19. A plasma processing method, comprising the steps of:
forming a film on a substrate placed on a substrate table in a processing chamber through plasma generation in said processing chamber by applying an RF power while feeding at least a gas or gases, which react to deposit said film, into said processing chamber;
separating said substrate from said substrate table while feeding at least said gas or said gases into said processing chamber with the application of the RF power being stopped; and
removing said substrate from said processing chamber, whereby substrate transfer error or dielectric breakdown of the substrate is avoided.

20. The plasma processing method as recited in claim 19, wherein said separating step separates said substrate from said substrate table while feeding said gas or said gases into said processing chamber with the application of the RF power being stopped.

21. A plasma processing method comprising steps of:

forming a film on a substrate placed on a substrate table in a processing chamber in a first gas atmosphere comprising a gas or gases which react to deposit said film through plasma generation in said processing chamber by applying an RF power;

separating said substrate from said substrate table in a second gas atmosphere comprising said gas or said gases with the application of the RF power being stopped; and removing said substrate from said processing chamber, whereby substrate transfer error or dielectric breakdown of the substrate is avoided.

22. The plasma processing method as recited in claim 21, wherein said second gas atmosphere is identical to said first said gas atmosphere.

* * * * *